(12) United States Patent
Knobloch

(10) Patent No.: US 6,794,095 B2
(45) Date of Patent: Sep. 21, 2004

(54) METHOD OF FABRICATING A MICROSTRUCTURE AND PHOTOLITHOGRAPHY TRIMMING MASK

(75) Inventor: Jürgen Knobloch, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/262,117

(22) Filed: Oct. 1, 2002

(65) Prior Publication Data

US 2003/0077908 A1 Apr. 24, 2003

(30) Foreign Application Priority Data

Oct. 1, 2001 (DE) ............................. 101 49 304

(51) Int. Cl.$^7$ .................................................. G03F 9/00
(52) U.S. Cl. .......................................................... 430/5
(58) Field of Search ............................ 430/5, 30, 394; 378/34, 35; 355/18

(56) References Cited

U.S. PATENT DOCUMENTS 5,538,833 A * 7/1996 Ferguson et al. ........... 430/325
6,544,694 B2 * 4/2003 Dirksen et al. ................. 430/5

* cited by examiner

*Primary Examiner*—Mark F. Huff
*Assistant Examiner*—Saleha Mohamedulla
(74) *Attorney, Agent, or Firm*—Laurence A. Greenberg; Werner H. Stemer; Ralph E. Locher

(57) ABSTRACT

A photolithographic fabrication method for a microstructure on a substrate, in particular interconnects of a DRAM (dynamic random access memory), includes a first exposure with at least one alternating phase mask. Then, at least one postexposure is carried out after the first exposure with a trimming mask. The trimming mask has at least two trimming openings for producing at least one alternating phase shift. Postexposure even of very small parts of microstructures is thus possible, so that the entire microstructure can be arranged in a space-saving manner on the substrate.

4 Claims, 2 Drawing Sheets

METHOD OF FABRICATING A MICROSTRUCTURE AND PHOTOLITHOGRAPHY TRIMMING MASK

BACKGROUND OF THE INVENTION

Field of the Invention

The invention relates to a method for the photolithographic fabrication of a microstructure on a substrate, in particular interconnects of a DRAM (dynamic random access memory) component, with a first exposure with at least one alternating phase mask. The invention further relates to a trimming mask for postexposure during a photolithographic fabrication of a microstructure on a substrate.

Photolithographic methods are often used for fabricating microstructures on a substrate, e.g. a semiconductor material. The methods use a mask with a predetermined pattern for imaging the microstructure onto the substrate. The pattern on the mask thereby comprises light-transmissive (transparent) and light-opaque parts, the light-opaque parts generally being formed by chrome on glass (COG).

In this case, the size and form of the microstructures which can be fabricated by photolithography are limited, in principle, by the light wavelength used and the optical system used in the exposure apparatus.

In order to be able to fabricate microstructures smaller than the light wavelength used during the photolithography, the concept of the alternating phase mask has been developed. In that case, with a mask, a phase shift (0°/180°) of the light used for exposure is partly produced in a targeted manner, so that a shadowing is produced in some regions on the semiconductor material in a targeted manner as a result of destructive interference of the light. It is thus possible to form finer microstructures on the substrate, such as e.g. interconnects on a semiconductor substrate, than with masks without an alternating phase shift.

In the case of these phase shift mask assemblies, there is the problem that, in a layout, not all parts of a microstructure can be exposed with a single alternating phase mask, so that particular locations lying between regions with a different phase shift have to be postexposed. Moreover, in a layout design, parts of the microstructure may lie so close together that unambiguous assignment to one of the two phase values is not possible during a postexposure.

The postexposure required is effected with the aid of trimming masks. Such trimming masks correspond to the construction of the conventional COG masks.

What is disadvantageous in this case is that the openings of the trimming masks for postexposure are in turn diffraction-limited, so that it is necessary to comply with a minimum distance between the trimming openings. During the fabrication of very small microstructures, the situation occurs wherein the trimming openings must lie at minimum pitch, that is to say with a distance of twice the minimum structure width (2×CD critical dimension) of the corresponding photolithography method.

Therein lies a limitation of the postexposure, so that specific fine microstructures cannot be fabricated and the distances between the parts of the microstructure must be increased. This has the result that the microstructures must take up a larger area on the substrate.

SUMMARY OF THE INVENTION

It is accordingly an object of the invention to provide a photolithography method for the fabrication of a microstructure on a substrate and to a postexposure trimming mask, which overcome the above-mentioned disadvantages of the heretofore-known devices and methods of this general type and which allow very precise postexposure even of very small parts of microstructures, so that the entire microstructure can be arranged in a space-saving manner on the substrate.

With the foregoing and other objects in view there is provided, in accordance with the invention, a photolithography method for fabricating a microstructure on a substrate. The method comprises:

exposing in a first exposure with at least one alternating phase mask;

providing a trimming mask having at least two trimming openings for producing an alternating phase shift; and exposing in at least one postexposure, following the first exposure, with the trimming mask having the at least two trimming openings.

By virtue of the fact that at least one postexposure is carried out after the first exposure with a trimming mask which has at least two trimming openings for producing an alternating phase shift, it is possible to minimize the distance between the trimming openings. Particularly fine details of a microstructure, such as, for example, interconnects of a DRAM, can thus be fabricated during the postexposure.

It is advantageous if a postexposure with a trimming mask is automatically provided as soon as two parts of the microstructure have or fall below a predeterminable distance.

In accordance with a further advantageous refinement of the method according to the invention, the predeterminable distance is the respective smallest possible value for the distance between microstructures in the case of a predetermined photolithography method.

The substrate is advantageously a semiconductor material, a ceramic or a metal. The method according to the invention can be used during a photolithographic processing of these materials.

Particular advantages are afforded if the microstructure to be produced is a gate structure of a chip, an ASIC (application-specific integrated circuit) or a grid circuit of a DRAM component, since in this case it is necessary to fabricate a multiplicity of particularly closely adjacent microstructures.

With the above and other objects in view there is also provided, in accordance with the invention, a trimming mask for postexposure during a photolithographic fabrication of a microstructure on a substrate. The trimming mask has at least two trimming openings formed therein for producing at least one alternating phase shift.

There is thus also provided, in accordance with the invention a novel trimming mask for a photolithography processing system with an alternating phase mask for exposing the substrate in a first exposure. The trimming mask is provided for postexposure following the first exposure and the trimming mask comprises a trimming mask structure having at least two trimming openings formed therein for producing at least one alternating phase shift in the postexposure.

By virtue of the fact that the trimming mask has at least two trimming openings for producing an alternating phase shift, it is possible to achieve a destructive interference during the exposure for fabrication of small structures.

In accordance with a concomitant feature of the invention, a spacing distance between the at least two trimming openings is less than or equal to a distance defined as a minimum distance between parts of the microstructure relative to a given photolithography process.

Other features which are considered as characteristic for the invention are set forth in the appended claims.

Although the invention is illustrated and described herein as embodied in a method for the fabrication of a microstructure and trimming mask for the photolithography, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
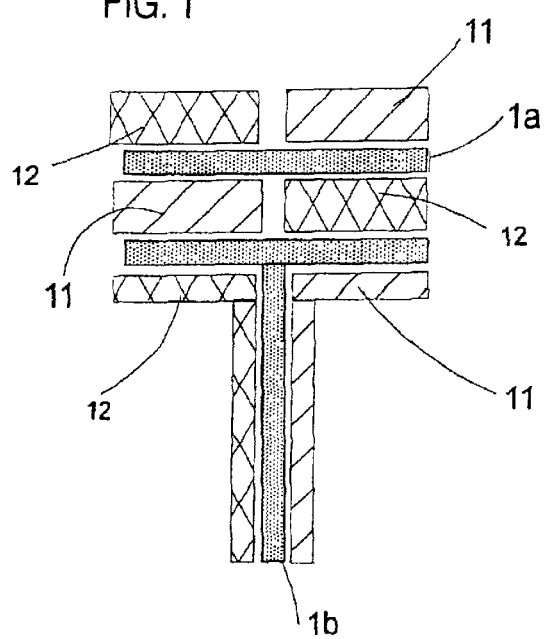
FIG. 1 is a diagrammatic illustration of a microstructure to be imaged with regions of alternating phases.

Referring now to the figures of the drawing in detail and first, particularly, to FIG. 1 thereof, there is shown a part of a microstructure 1a, 1b to be imaged. The microstructure is to be fabricated on a semiconductor material substrate with an alternating phase mask. While the exemplary description refers to semiconductor substrates, it is also possible, in principle, to use other substrates, such as, for instance, ceramic or metal.

The term microstructure is understood to be any structure which can be applied to a substrate by way of a photolithographic method. This includes, in particular, complete chips (e.g. DRAMs) and parts of the layout of such chips. The fabrication of very fine microstructures is necessary precisely also in the case of ASICs (application-specific ICs), gate structures or a grid circuit of DRAMs (dynamic random access memories).

When using alternating phases, regions 11, 12 with a different phase are used on the semiconductor material during the photolithography. In the present case, regions with a phase shift of 0° are to be designated as first regions 11, and regions with a phase shift of 180° are to be designated as second regions 12. In FIG. 1, the regions 11, 12 are identified by different hatching, namely, the non-shifted areas 11 are illustrated with a straight slant hatch and the phase-shifted areas 12 are illustrated with a cross-hatch.

Destructive interference during an overlapping of exposed regions 11, 12 with a different phase shift produces a dark zone so that the microstructure 1a, 1b is produced during exposure of the semiconductor substrate.

The upper part of the microstructure 1a is surrounded by regions 11, 12 with a different phase shift. In this case, the regions 11, 12 with a different phase shift almost adjoin one another in the lateral direction.

It is precisely in this transition region that a postexposure with a trimming mask 20 is required.

Figure 2:
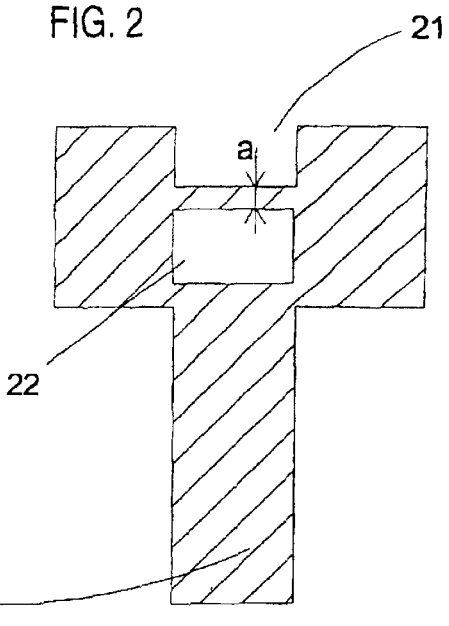
FIG. 2 is a diagrammatic illustration of a conventional prior art trimming mask.

Such a fundamentally known trimming mask 20 is illustrated diagrammatically in FIG. 2, provision being made of an upper trimming opening 21 and a lower trimming opening 22 for the exposure of the corresponding regions of the adjacent regions 11, 12 in FIG. 1. In order that the trimming openings 21, 22 can be resolved on the semiconductor material, the distance a between the regions is not permitted to fall below a minimum value. In this case, the minimum magnitude depends on the wavelength used and the photolithography installation. Typical wavelengths of methods that are used or will soon be realized are 193 nm or 157 nm.

With a conventional postexposure it is not possible to arrange microstructures 1a, 1b at a distance from one another which falls below this value. In FIG. 2, the distance a is intended to correspond exactly to the minimum value. In this connection, the term minimum can be understood such that it is the distance which relates to the smallest transistor gate length that can be realized by means of the respective prior art.

Figure 3:
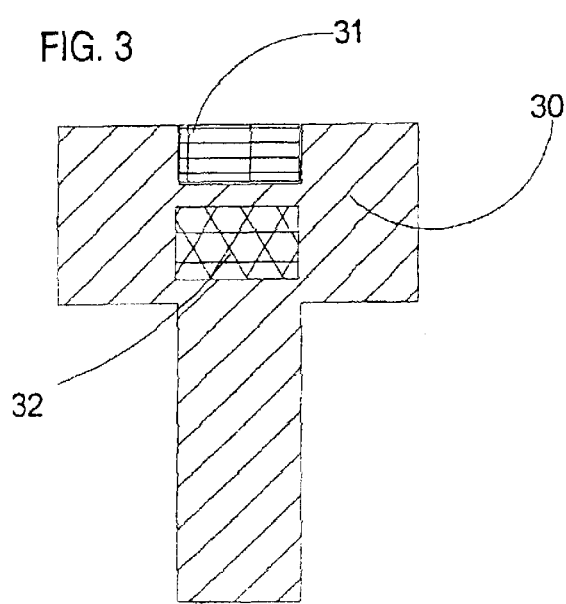
FIG. 3 is a diagrammatic illustration of a trimming mask according to the invention, with an alternating phase mask.

FIG. 3 diagrammatically illustrates a trimming mask 30 according to the invention. In this case, the trimming openings 31, 32 are formed with phase shifting means. The upper trimming opening 31 produces a phase shift of 0° and the lower trimming opening 32 produces a phase shift of 180°.

The production of an alternating phase shift in the trimming mask 30 according to the invention in conduction with the trimming openings 31, 32 produces a destructive interference. In this case, the resulting dark field between the trimming openings may be smaller than the minimum distance a mentioned above. During the postexposure, the phase-shifted trimming openings 31, 32 can be resolved separately even with smaller distances than would be possible in the case of a conventional trimming mask (see FIG. 2).

Figure 4:
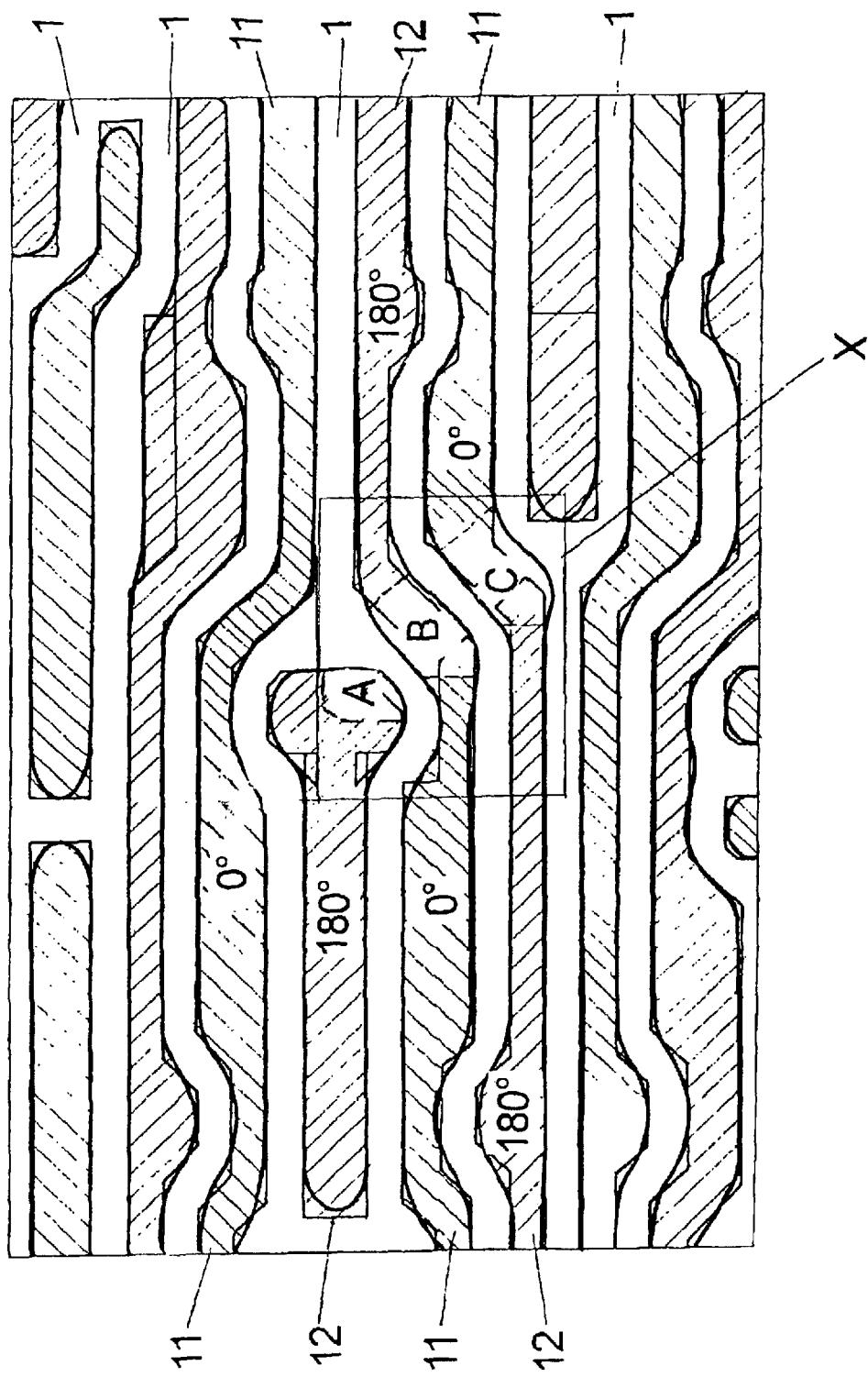
FIG. 4 is a detail from a layout for a microstructure on a semiconductor material.

FIG. 4 illustrates a detail from a microstructure 1, namely interconnects of a DRAM. The interconnects are intended to be arranged as close together as possible in order to minimize the area requirement of the interconnects 1.

The arrangement of the interconnects 1 is defined in the context of the layout design. For the fabrication of the DRAM, this layout is converted to an alternating phase mask layout, specific regions 11, 12 being formed as a dark field. For reasons of clarity, not all of the interconnects 1 and regions 11, 12 are provided with reference symbols in FIG. 1.

The printing of the structures requires adjacent regions 11, 12 in each case to be of in-antiphase nature, since only thus does the desired destructive interference occur. Only then are the interconnects of the microstructure 1 printed correctly on the semiconductor material.

Analogously to FIG. 1, the first regions 11 have a phase shift of 0° and the second regions 12 have a phase shift of 180°.

A problem arises when parts of regions 11, 12 become so close that an efficient dark field cannot be produced during the exposure of the regions 11, 12, so that a postexposure with a trimming mask 30 is necessary.

In the detail X, three regions are so close together that an unambiguous assignment of the phase shifts is not possible. A postexposure with a conventional trimming mask 20, i.e. without a phase shift, would not be effective here since the distances between the trimming openings 21, 22 would be too close together here.

In FIG. 4, postexposure fields A, B, C produced by means of the trimming mask 30 according to the invention with an alternating phase shift are separated by a broken line from the respectively adjacent regions 11, 12. As a result, it is again possible to produce opposite phase shifts at the bottleneck, so that the interconnects 1 can be arranged in a space-saving manner here as desired.

In the example, the first postexposure field A has a phase shift of 0°, the second postexposure field B has a phase shift of 180° and the third postexposure field C again has a phase shift of 0°.

The phase shifts are specified at a few other regions 11, 12 by way of example in FIG. 4, in order to specify the opposite nature of the phase shift.

The embodiment of the invention is not restricted to the preferred exemplary embodiments specified above. Rather, a number of variants are conceivable which make use of the method according to the invention and the trimming mask according to the invention also in the case of embodiments of fundamentally different configuration.

I claim:

1. A trimming mask for postexposure during a photolithographic fabrication of a microstructure on a substrate, which comprises a trimming mask structure having at least two trimming openings formed therein, said trimming openings being formed with a spacing distance therebetween less than or equal to a distance defined as a minimum distance between parts of the microstructure relative to a given photolithography process, and adjacent said trimming openings being formed to effect an alternating phase shift between said two trimming openings.

2. In a photolithography processing system for fabricating a microstructure on a substrate, wherein an alternating phase mask is employed for exposing the substrate in a first exposure, and a trimming mask is employed for postexposure following the first exposures, a trimming mask comprising a trimming mask structure having at least two trimming openings formed therein, said trimming openings being formed with a spacing distance therebetween less than or equal to a distance defined as a minimum distance between parts of the microstructure relative to a given photolithography process, and adjacent said trimming openings being formed to effect an alternating phase shift between said two trimming openings in the postexposure.

3. The trimming mask according to claim 2, wherein said trimming openings are formed to effect an alternating phase shift with a phase difference between said adjacent openings of substantially 180°.

4. The trimming mask according to claim 1, wherein said trimming openings are formed to effect an alternating phase shift with a phase difference between said adjacent openings of substantially 180°.

* * * * *